United States Patent
Tang et al.

(10) Patent No.: US 10,770,153 B2
(45) Date of Patent: Sep. 8, 2020

(54) CHARGE PUMP DRIVE CIRCUIT WITH TWO SWITCH SIGNALS

(71) Applicant: Wuhan Xinxin Semiconductor Manufacturing Co., Ltd., Wuhan, Hubei (CN)

(72) Inventors: Yuan Tang, San Jose, CA (US); Zhifeng Mao, Hubei (CN); Yi Xu, Hubei (CN); Hung-Yu Chang, San Jose, CA (US); Jen-Tai Hsu, San Jose, CA (US)

(73) Assignee: WUHAN XINXIN SEMICONDUCTOR MANUFACTURING CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/226,094

(22) Filed: Dec. 19, 2018

(65) Prior Publication Data

US 2019/0318789 A1    Oct. 17, 2019

(30) Foreign Application Priority Data

Apr. 12, 2018  (CN) ........................ 2018 1 0327023

(51) Int. Cl.
*G11C 16/30* (2006.01)
*G11C 16/26* (2006.01)
(Continued)

(52) U.S. Cl.
CPC .............. *G11C 16/30* (2013.01); *G11C 16/26* (2013.01); *H02M 3/07* (2013.01); *H03K 5/24* (2013.01); *G11C 16/14* (2013.01)

(58) Field of Classification Search
CPC ......... G11C 16/30; G11C 16/26; G11C 16/14; G11C 5/145; G11C 2207/2227; H03K 5/24; Y02B 70/16; H02M 1/08
See application file for complete search history.

(56) References Cited

U.S. PATENT DOCUMENTS

| 5,629,646 A | 5/1997 | Menezes et al. |
| 5,880,622 A * | 3/1999 | Evertt .................... G11C 16/30 327/535 |

(Continued)

FOREIGN PATENT DOCUMENTS

| CN | 1050651 A | 4/1991 |
| CN | 1467748 A | 1/2004 |
| CN | 102684478 A | 9/2012 |

*Primary Examiner* — Sultana Begum
(74) *Attorney, Agent, or Firm* — Muncy, Geissler, Olds & Lowe, P.C.

(57) ABSTRACT

A charge pump drive circuit is disclosed. The charge pump drive circuit provides a switch signal to a charge pump which provides a memory with a read voltage and a read current. The charge pump drive circuit includes a read drive circuit and a standby drive circuit. The read drive circuit is powered by a first power supply and provides the charge pump with a switch signal when the memory is in an active reading state. The standby drive circuit is powered by a second power supply and provides the charge pump with a switch signal when the memory is in a read standby state. The first power supply provides a voltage level ranging from 1.6 V to 3.8 V, and the second power supply provides a voltage level of 1.5 V.

7 Claims, 1 Drawing Sheet

(51) Int. Cl.
  *H02M 3/07*   (2006.01)
  *H03K 5/24*   (2006.01)
  *G11C 16/14*  (2006.01)

(56) References Cited

U.S. PATENT DOCUMENTS

| | | | |
|---|---|---|---|
| 2003/0151957 A1 | 8/2003 | Pekny | |
| 2004/0190361 A1* | 9/2004 | Tokui | G11C 16/30 365/226 |
| 2005/0213387 A1* | 9/2005 | Kubo | G11C 5/145 365/185.21 |
| 2006/0119440 A1* | 6/2006 | Isobe | H03L 7/0802 331/16 |

* cited by examiner

CHARGE PUMP DRIVE CIRCUIT WITH TWO SWITCH SIGNALS

CROSS-REFERENCE TO RELATED APPLICATION

This application claims the priority of Chinese patent application number 201810327023.1, filed on Apr. 12, 2018, the entire contents of which are incorporated herein by reference.

TECHNICAL FIELD

The present invention relates to the field of semiconductor technology and, in particular, to a charge pump drive circuit.

BACKGROUND

A charge pump circuit is a basic block of a flash memory and greatly affects the flash memory's program/erase speed. The continuous advancement of integrated circuit (IC) fabrication technology and our relentless pursuit for lower power consumption lead to the development of ICs powered by increasingly lower supply voltages.

On the other hand, in flash memories, program/erase operations of a cell still require relatively high voltages. In such a context, more and more importance is being attached to charge pump circuits in the continuously-developing IC domain. Currently, charge pumps have become a focus of research efforts in the field of flash memory design.

A charge pump, also known as a switched-capacitor voltage converter, is a kind of DC to DC converter that uses so-called "flying" or "pumping" capacitors (rather than inductors or transformers) for energetic charge storage to raise, lower an input voltage or to produce a negative voltage. An internal field effect transistors (FET) switch array of the charge pump controls transfer of electric charges among the capacitors in a certain manner (usually, uses clock signals to control the charge/discharge of the capacitors) so that the input voltage is raised (or reduced) in a certain way to a desired output level.

When a memory is reading data, a charge pump therein provides the memory with a read current and a read voltage of about 5.5 V. Therefore, before the read operation begins, the charge pump needs to raise the voltage to 5.5 V to place the memory into a standby state. After the read operation commences, the memory switches to an active reading state. In the standby state, as the output voltage of the charge pump may experience drops due to leakage currents, a detection circuit is required to monitor the output voltage of the charge pump in real time so as to increase the output voltage when it drops below the read voltage. If the detection circuit is powered by a supply voltage of 5.5 V, it will require a relatively large current and thus consume a significant power.

SUMMARY OF THE INVENTION

It is an object of the present invention to provide a charge pump drive circuit which does not require a great current during a read standby state of a memory in which it is employed.

To this end, the present invention proposes a charge pump drive circuit for providing a charge pump with a switch signal, the charge pump providing a memory with a read voltage and a read current, the charge pump drive circuit comprising a read drive circuit and a standby drive circuit, wherein:

the read drive circuit is powered by a first power supply and provides the charge pump with a first switch signal when the memory is in a read active state;

the standby drive circuit is powered by a second power supply and provides the charge pump with a second switch signal when the memory is in a read standby state; and the first power supply provides a voltage level ranging from 1.6 V to 3.8 V and the second power supply provides a voltage level of 1.5 V.

Optionally, the charge pump drive circuit may further comprise an OR gate having two inputs connected respectively to an output of the read drive circuit and an output of the standby drive circuit and an output connected to the charge pump.

Optionally, in the charge pump drive circuit, when the memory is in a writing, erasing or programming state, the read drive circuit may provide the charge pump with the first switch signal.

Optionally, the charge pump drive circuit may further comprise a first signal selection circuit and a second signal selection circuit, wherein:

the first signal selection circuit is provided with a first reference signal, a second reference signal and a selection signal;

the second signal selection circuit is provided with a first feedback voltage, a second feedback voltage and the selection signal;

the selection signal is dependent on the state of the memory;

when the memory is in the active reading state or the read standby state, the selection signal causes the first signal selection circuit to output the first reference signal and causes the second signal selection circuit to output the first feedback voltage; and when the memory is in the writing, erasing or programming state, the selection signal causes the first signal selection circuit to output the second reference signal and causes the second signal selection circuit to output the second feedback voltage.

Optionally, the charge pump drive circuit may further comprise a first resistor network and a second resistor network, wherein:

each of the first resistor network and the second resistor network is connected between an output of the charge pump and a ground; and the first feedback voltage is coupled to the first resistor network and the second feedback voltage is coupled to the second resistor network.

Optionally, in the charge pump drive circuit, the read drive circuit may comprise a first comparator and a first voltage controlled oscillator (VCO), wherein:

the first comparator has a non-inverting input connected to an output of the first signal selection circuit, an inverting input connected to an output of the second signal selection circuit and an output connected to an input of the first VCO; and the first VCO has an output serving as the output of the read drive circuit.

Optionally, in the charge pump drive circuit, the read drive circuit may further comprise two first switches, wherein:

the first power supply respectively powers the first comparator and the first VCO via the two first switches, and the first switches are opened or closed under the control of a first switch signal.

Optionally, in the charge pump drive circuit, the standby drive circuit may comprise a second comparator and a second VCO, wherein:

the second comparator has a non-inverting input connected to an output of the first signal selection circuit, an inverting input connected to an output of the second signal selection circuit and an output connected to an input of the second VCO; and the second VCO has an output connected to the output of the standby drive circuit.

Optionally, in the charge pump drive circuit, the standby drive circuit may further comprise two second switches, wherein:

the second power supply respectively powers the second comparator and the second VCO via the two second switches; and the second switches are opened or closed under control of a second switch signal.

Optionally, the charge pump drive circuit may further comprise an electrical level shifting circuit connected between the output of the second VCO and one of the inputs of the OR gate.

The present invention proposes a charge pump drive circuit for providing a charge pump with a switch signal, the charge pump configured to provide a memory with a read voltage and a read current, the charge pump drive circuit comprising a read drive circuit, a standby drive circuit and an OR gate, wherein:

the read drive circuit is powered by a first power supply and provides a first switch signal for the charge pump when the memory is in a read active state;

the standby drive circuit is powered by a second power supply and provides a second switch signal for the charge pump when the memory is in a read standby state;

the OR gate has two inputs connected respectively to an output of the read drive circuit and an output of the standby drive circuit and an output connected to the charge pump; and the first power supply provides a voltage level ranging from 1.6 V to 3.8 V and the second power supply provides a constant voltage lower than the first power supply.

Optionally, in the charge pump drive circuit, when the memory is in a writing, erasing or programming state, the read drive circuit may provide the first switch signal for the charge pump.

Optionally, the charge pump may further comprise a first signal selection circuit and a second signal selection circuit, wherein:

the first signal selection circuit is provided with a first reference signal, a second reference signal and a selection signal;

the second signal selection circuit is provided with a first feedback voltage, a second feedback voltage and the selection signal;

the selection signal is dependent on the state of the memory;

when the memory is in the read active state or the read standby state, the selection signal causes the first signal selection circuit to output the first reference signal and causes the second signal selection circuit to output the first feedback voltage; and when the memory is in the writing, erasing or programming state, the selection signal causes the first signal selection circuit to output the second reference signal and causes the second signal selection circuit to output the second feedback voltage.

Optionally, the charge pump drive circuit may comprise a first resistor network and a second resistor network, wherein:

each of the first resistor network and the second resistor network is connected between an output of the charge pump and a ground; and the first feedback voltage is coupled to the first resistor network and the second feedback voltage is coupled to the second resistor network.

Optionally, in the charge pump drive circuit, the read drive circuit comprises a first comparator and a first voltage controlled oscillator (VCO), the first comparator having a non-inverting input connected to an output of the first signal selection circuit, the first comparator having an inverting input connected to an output of the second signal selection circuit, the first comparator having an output connected to an input of the first VCO, the first VCO having an output serving as the output of the read drive circuit.

Optionally, in the charge pump drive circuit, the read drive circuit further comprises two first switches, wherein the first power supply respectively powers the first comparator and the first VCO via the two first switches, and wherein the first switches are opened or closed under control of a first switch signal.

Optionally, in the charge pump drive circuit, the standby drive circuit comprises a second comparator and a second VCO, the second comparator having a non-inverting input connected to an output of the first signal selection circuit, the second comparator having an inverting input connected to an output of the second signal selection circuit, the second comparator having an output connected to an input of the second VCO, the second VCO having an output serving as the output of the standby drive circuit.

Optionally, in the charge pump drive circuit, the standby drive circuit further comprises two second switches, wherein the second power supply respectively powers the second comparator and the second VCO via the two second switches, and wherein the second switches are opened or closed under control of a second switch signal.

Optionally, the charge pump drive circuit may further comprise an electrical level shifting circuit connected between the output of the second VCO and one of the inputs of the OR gate.

In the charge pump drive circuit of the present invention, when the memory is in the read standby state, the standby drive circuit is powered by the second power supply and provides the charge pump with a switch signal. Additionally, the first power supply provides a voltage level ranging from 1.6 V to 3.8 V, and the second power supply provides a voltage level of 1.5 V. Powering the standby drive circuit with the constant lower level (1.5 V) provided by the second power supply in the read standby state enables the operation in the standby state at a current maintained at a minimized level.

In these figures: 10, denotes a charge pump; 20, a read drive circuit; 21, a first VCO; 30, a standby drive circuit; 31, a second VCO; 40, a first signal selection circuit; 50, a second signal selection circuit; 60, a first resistor network; 70, a second resistor network; and 80, a level shifting circuit.

DETAILED DESCRIPTION

The charge pump drive circuit constructed in accordance with this invention will be described below in further detail with reference to the accompanying drawings and specific embodiments. Features and advantages of the invention will be more apparent from the following detailed description, and from the appended claims. It is noted that the figures are provided in a very simplified form not necessarily presented to scale, with the only intention to facilitate convenience and clarity in explaining the embodiments of the invention.

The core concept of the present invention is to provide a charge pump drive circuit which does not require a great current during a read standby state of a memory in which it is employed.

To this end, the present invention provides a charge pump drive circuit for providing a switch signal to a charge pump which provides a memory with a read voltage and a read current. The charge pump drive circuit comprises a read drive circuit and a standby drive circuit. The read drive circuit is powered by a first power supply and provides the charge pump with the switch signal when the memory is in an active reading state. The standby drive circuit is powered by a second power supply and provides the charge pump with the switch signal when the memory is in a read standby state. The first power supply provides a voltage level ranging from 1.6 V to 3.8 V and the second power supply provides a voltage level of 1.5 V.

Figure 1:
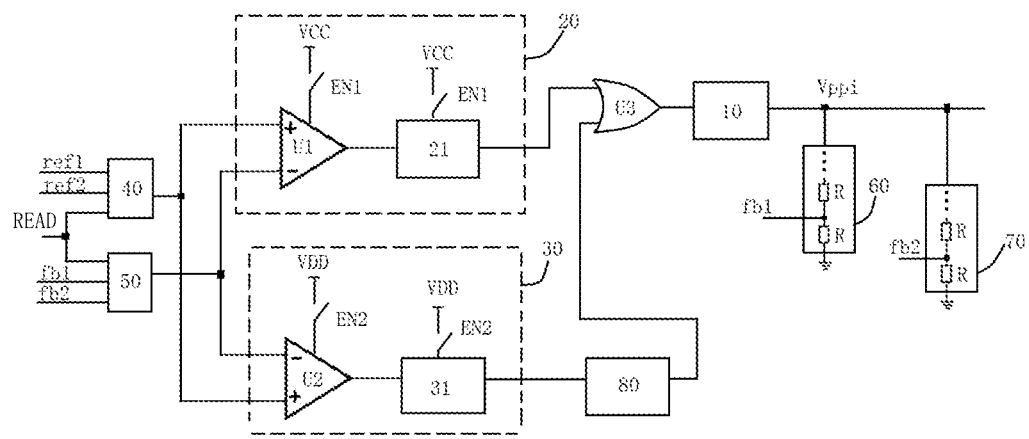
FIG. 1 is a schematic illustration of a charge pump drive circuit according to an embodiment of the present invention.

FIG. 1 is a schematic illustration of a charge pump drive circuit according to an embodiment of the present invention, for providing a charge pump 10 with a switch signal. The charge pump 10 provides a memory with a read voltage and a read current. The charge pump drive circuit comprises a read drive circuit 20 and a standby drive circuit 30. The read drive circuit 20 is powered by a first power supply VCC and provides the charge pump 10 with the switch signal when the memory is in the read active state. The standby drive circuit 30 is powered by a second power supply VDD and provides the charge pump 10 with the switch signal when the memory is in the read standby state. The first power supply VCC provides a voltage level ranging from 1.6 V to 3.8 V and the second power supply VDD provides a voltage level of 1.5 V.

As shown in FIG. 1, the charge pump drive circuit may further comprise an OR gate U3 having two inputs connected respectively to an output of the read drive circuit 20 and an output of the standby drive circuit 30 and an output connected to the charge pump 10.

Specifically, the charge pump drive circuit may further comprise a first signal selection circuit 40 and a second signal selection circuit 50. The first signal selection circuit 40 is provided with a first reference signal ref1, a second reference signal ref2 and a selection signal READ, and the second signal selection circuit 50 is provided with a first feedback voltage fb1, a second feedback voltage fb2 and the selection signal READ. The charge pump drive circuit may further comprise a first resistor network 60 and a second resistor network 70. Each of the first resistor network 60 and the second resistor network 70 is connected between an output of the charge pump 10 which outputs a voltage of Vppi and the ground. The first feedback voltage fb1 is coupled to the first resistor network 60, and the second feedback voltage fb2 is coupled to the second resistor network 70.

In the read active state or the read standby state of the memory (with the selection signal READ at a high level), the selection signal READ may cause the first signal selection circuit 40 to output the first reference signal ref1 and cause the second signal selection circuit 50 to output the first feedback voltage fb1. The first reference signal ref1 may be a constant-value signal provided by a band-gap reference circuit. In case of the first resistor network 60 consisting of five resistors R, with the first feedback voltage fb1 being coupled to a node preceding the last resistor R and with Vppi being exactly of 5.5 V, the first feedback voltage should be 1.1 V, i.e., first reference signal ref1 should be provided by the band-gap reference circuit with an output voltage of 1.1 V. When the memory is in the writing, erasing or programming state (with the selection signal READ at a low voltage level and inverted with respect to a mode signal), the selection signal READ may cause the first signal selection circuit 40 to output the second reference signal ref2 and cause the second signal selection circuit 50 to output the second feedback voltage fb2. The second reference signal ref2 may be generated by dividing the first reference signal ref1 and therefore its level is usually lower than that of the first reference signal ref1. The division may depend on practical needs. For example, it may be determined by a required level of the output voltage Vppi and the number of resistors in the second resistor network 70. In case of the second feedback voltage fb2 being coupled to a node preceding the last resistor R in the second resistor network 70, the second feedback voltage will be equal to Vppi divided by the number of the resistors in the second resistor network 70.

Figure 2:
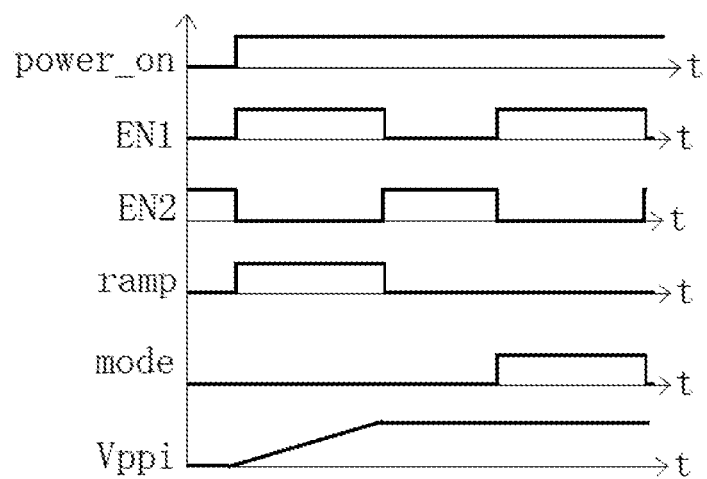
FIG. 2 schematically illustrates waveforms of various signals in a charge pump drive circuit according to another embodiment of the present invention.

Additionally, in the charge pump drive circuit, the read drive circuit 20 may include a first comparator U1 and a voltage controlled oscillator (VCO) 21. The first comparator has a non-inverting input connected to an output of the first signal selection circuit 40, an inverting input connected to an output of the second signal selection circuit 50 and an output connected to an input of the first VCO 21. The first VCO 21 has an output serving as the output of the read drive circuit 20. The read drive circuit 20 may further include two first switches EN1 through which the first power supply VCC respectively powers the first comparator U1 and the first VCO 21. As shown in FIG. 2, the first switches EN1 may be opened or closed under the control of a first switch signal EN1. A waveform of the first switch signal EN1 is shown in FIG. 2. The first switches may be closed at a high level of the first switch signal EN1 and opened at a low level thereof. The standby drive circuit 30 may include a second comparator U2 and a second VCO 31. The second comparator U2 has a non-inverting input connected to the output of the first signal selection circuit 40, an inverting input connected to the output of the second signal selection circuit 50 and an output connected to an input of the second VCO 31. The second VCO 31 has an output serving as the output of the standby drive circuit 30. The standby drive circuit 30 may further include two second switches EN2 through which the second power supply VDD respectively powers the second comparator U2 and the second VCO 31. The second switches EN2 may be opened or closed under the control of a second switch signal EN2. A waveform of the second switch signal EN2 is shown in FIG. 2. The second switches may be closed at a high level of the second switch signal EN2 and opened at a low level thereof. The first switch signal EN1 and second switch signal EN2 do not overlap in time. That is, the read drive circuit and standby drive circuit do not provide the switch signals to the charge pump at the same time.

When the memory is in the writing, erasing or programming state, the read drive circuit 20 provides the charge pump 10 with the switch signal. As shown in FIG. 2, when the mode signal is at a high level, the memory is in the writing, erasing or programming state. At this point, the signal EN1 is at the high level, causing the first switches EN1 to be closed. As a result, the first power supply VCC powers the first comparator U1 and the first VCO 21. At the same time, the signal EN2 is at the low voltage level, causing the second switches EN2 to be opened. Consequently, the second power supply VDD cannot power the second comparator U2 and the second VCO 31. The charge pump drive circuit may further include an electrical level shifting circuit 80 connected between the output of the second VCO 31 and the input of the OR gate U3. The electrical level shifting circuit 80 is configured to shift the second power supply VDD at its input to the first power supply VCC and provide it to the OR gate, in order to ensure a full response of the OR gate U3.

When the first switch signal EN1 is at the high level concurrently with the second switch signal EN2 at the low level, VCC is activated while VDD is not. When in the read active state, the first comparator U1 outputs an analog voltage signal based on the first reference signal ref1 and the first feedback voltage fb1. When in the writing, erasing, programming or another state, the first comparator U1 outputs the analog voltage signal based on the second reference signal ref2 and the second feedback voltage fb2. The analog voltage signal controls a pulse frequency which is output by the first VCO 21 and the pulse frequency, in turn, controls the amplitude of the output voltage of the charge pump. At this point, the charge pump will require an additional drive current which may, when large in magnitude, cause a decrease in the output voltage. So, it is necessary to prevent this from happening.

When the first switch signal EN1 is at the low level concurrently with the second switch signal EN2 at the high level, VDD is activated while VCC is not. As a result, the memory will be certainly in the read standby state, in which the second comparator U2 outputs, based on the first reference signal and the first feedback voltage, a single-pulse signal which controls the second VCO 31 to output another single-pulse signal and slightly increases the amplitude of the output voltage of the charge pump with the aid of the OR gate U3. At this point, the only thing needed is to boost the output voltage.

In the charge pump drive circuit of the present invention, when the memory is in the read standby state, the standby drive circuit 30 is powered by the second power supply VDD and provides the charge pump 10 with the switch signal. Additionally, the first power supply VCC provides a voltage level ranging from 1.6 V to 3.8 V, and the second power supply provides a voltage level of 1.5 V. Powering the standby drive circuit 30 with the constant lower voltage level (1.5 V) provided by the second power supply VDD in the read standby state enables the operation in the standby state at a current maintained at a minimized level.

In summary, various configurations of the charge pump drive circuit have been detailed in the above embodiments. Of course, the present invention includes, but not limited to, the configurations disclosed above, and any and all modifications made to these configurations are considered to fall within the scope of the invention. Those skilled in the art can extend the inventive ideas in many ways.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A charge pump drive circuit for providing a charge pump with a switch signal, the charge pump configured to provide a memory with a read voltage and a read current, the charge pump drive circuit comprising a read drive circuit and a standby drive circuit, wherein:
   the read drive circuit is powered by a first power supply and provides the charge pump with a first switch signal when the memory is in a read active state;
   the standby drive circuit is powered by a second power supply and provides the charge pump with a second switch signal when the memory is in a read standby state; and
   the first power supply provides a voltage level ranging from 1.6 V to 3.8 V and the second power supply provides a voltage level of 1.5 V;
   wherein the charge pump drive circuit further comprises an OR gate having two inputs connected respectively to an output of the read drive circuit and an output of the standby drive circuit and an output connected to the charge pump;
   wherein when the memory is in a writing, erasing or programming state, the read drive circuit provides the charge pump with the first switch signal;
   wherein the charge pump drive circuit further comprises a first signal selection circuit and a second signal selection circuit, wherein:
   the first signal selection circuit is provided with a first reference signal, a second reference signal and a selection signal;
   the second signal selection circuit is provided with a first feedback voltage, a second feedback voltage and the selection signal;
   the selection signal is dependent on the state of the memory;
   when the memory is in the read active state or the read standby state, the selection signal causes the first signal selection circuit to output the first reference signal and causes the second signal selection circuit to output the first feedback voltage; and
   when the memory is in the writing, erasing or programming state, the selection signal causes the first signal selection circuit to output the second reference signal and causes the second signal selection circuit to output the second feedback voltage.

2. The charge pump drive circuit of claim 1, further comprising a first resistor network and a second resistor network, wherein:
   each of the first resistor network and the second resistor network is connected between an output of the charge pump and a ground; and
   the first feedback voltage is coupled to the first resistor network and the second feedback voltage is coupled to the second resistor network.

3. The charge pump drive circuit of claim 1, wherein the read drive circuit comprises a first comparator and a first voltage controlled oscillator (VCO),
   the first comparator having a non-inverting input connected to an output of the first signal selection circuit,
   the first comparator having an inverting input connected to an output of the second signal selection circuit,
   the first comparator having an output connected to an input of the first VCO, the first VCO having an output serving as the output of the read drive circuit.

4. The charge pump drive circuit of claim 3, wherein the read drive circuit further comprises two first switches,
   wherein the first power supply respectively powers the first comparator and the first VCO via the two first switches,
   and wherein the first switches are opened or closed under control of a first switch signal.

5. The charge pump drive circuit of claim 1, wherein the standby drive circuit comprises a second comparator and a second VCO,
   the second comparator having a non-inverting input connected to an output of the first signal selection circuit,
   the second comparator having an inverting input connected to an output of the second signal selection circuit,
   the second comparator having an output connected to an input of the second VCO, the second VCO having an output serving as the output of the standby drive circuit.

6. The charge pump drive circuit of claim 5, wherein the standby drive circuit further comprises two second switches,
   the second power supply respectively powers the second comparator and the second VCO via the two second switches,
   and wherein the second switches are opened or closed under control of a second switch signal.

7. The charge pump drive circuit of claim 5, further comprising an electrical level shifting circuit connected between the output of the second VCO and one of the inputs of the OR gate.

\* \* \* \* \*